United States Patent
Li et al.

(10) Patent No.: US 8,568,828 B2
(45) Date of Patent: Oct. 29, 2013

(54) AMORPHOUS TIN-CADMIUM OXIDE FILMS AND THE PRODUCTION THEREOF

(75) Inventors: Xiaonan Li, Evergreen, CO (US); Timothy A. Gessert, Conifer, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 874 days.

(21) Appl. No.: 12/705,465

(22) Filed: Feb. 12, 2010

(65) Prior Publication Data

US 2011/0197958 A1 Aug. 18, 2011

(51) Int. Cl.
*C23C 16/00* (2006.01)

(52) U.S. Cl.
USPC ............. 427/255.32; 427/248.1; 427/255.23; 427/255.31

(58) Field of Classification Search
None
See application file for complete search history.

(56) References Cited

U.S. PATENT DOCUMENTS

| | | | |
|---|---|---|---|
| 4,652,463 A * | 3/1987 | Peters | 427/584 |
| 5,922,142 A | 7/1999 | Wu et al. | |
| 5,985,356 A | 11/1999 | Schultz et al. | |
| 6,137,048 A | 10/2000 | Wu et al. | |
| 6,221,495 B1 | 4/2001 | Wu et al. | |
| 2011/0197958 A1 | 8/2011 | Li et al. | |

OTHER PUBLICATIONS

Li, X. et al., "The properties of cadmium tin oxide thin-film compounds prepared by linear combinatorial synthesis," Applied Surface Science 223, pp. 138-143 (2004).
Coutts, T.J., et al., "High-Performance, Transparent Conducting Oxides Based on Cadmium Stannate," Journal of Electronic Materials, vol. 25, No. 6, pp. 935-943, 1996.
Nozik, A.J., "Optical and Electrical Properties of Dd2SnO4: A Defect Semiconductor," Physical Review B, vol. 6, No. 2, pp. 453-459, Jul. 15, 1972.
Haacke, G., "Transparent electrode properties of cadmium stannate," Applied Physics Letters, vol. 28, No. 10, pp. 622-623, May 15, 1976.

* cited by examiner

*Primary Examiner* — Joseph Miller, Jr.
(74) *Attorney, Agent, or Firm* — Paul J. White; J. Patrick Kendrick

(57) ABSTRACT

A tin-cadmium oxide film having an amorphous structure and a ratio of tin atoms to cadmium atoms of between 1:1 and 3:1. The tin-cadmium oxide film may have an optical band gap of between 2.7 eV and 3.35 eV. The film may also have a charge carrier concentration of between $1 \times 10^{20}$ cm$^{-3}$ and $2 \times 10^{20}$ cm$^{-3}$. The tin cadmium oxide film may also exhibit a Hall mobility of between 40 cm$^2$V$^{-1}$ s$^{-1}$ and 60 cm$^2$V$^{-1}$ s$^{-1}$. Also disclosed is a method of producing an amorphous tin-cadmium oxide film as described and devices using same.

10 Claims, 7 Drawing Sheets

AMORPHOUS TIN-CADMIUM OXIDE FILMS AND THE PRODUCTION THEREOF

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Transparent conducting oxide films (TCOs) are used extensively for a variety of applications including but not limited to architectural windows, flat-panel displays, thin-film photovoltaic devices, electrochromic windows, and polymer-based electronics. The electrical and optical properties of most TCOs fabricated by conventional techniques are adequate for many applications, but further improvement in both conductivity and transparency are desirable for TCOs used in semiconductor device fabrication.

Conductive $SnO_2$, typically doped with fluorine, is a popular TCO commonly used on low-emissivity windows and in solar cells as a front contact. $SnO_2$ has a relatively high optical bandgap in the range of 3.62 eV to 4.0 eV and moderate electron mobilities of about 13 $cm^2V^{-1} s^{-1}$ to 35 $cm^2V^{-1} s^{-1}$. CdO is another known TCO. Unlike $SnO_2$, CdO is not widely used due to the narrow optical band gap of CdO and the toxicity of cadmium. However, CdO has demonstrated electron mobilities that are five to ten times higher than other commercially available TCO materials. Electron mobility is a critical parameter for TCO materials used in semiconductor devices. High electron mobility will improve both the electronic and optical properties of a TCO material for many uses.

Cadmium stannate, $Cd_2SnO_4$, is comprised of a 2:1 atomic ratio mixture of CdO and SnO2 that is known to have unusually high electron mobility as well. $Cd_2SnO_4$ films also have low optical absorption in relevant wavelengths and high electrical conductivity. For example, a Hall mobility of over 60 $cm^2V^{-1} s^{-1}$ has been reported in thin-film $Cd_2SnO_4$ produced by radio frequency sputtering. In this previous report, charge carrier concentrations of $5\times10^{18}$ $cm^{-3}$ have been achieved in single-phase spinel-type $Cd_2SnO_4$ films which correspond to the observed high Hall mobility measurements. Several models have been proposed to explain the high electron mobility of spinel $Cd_2SnO_4$ including models indicating that the high electron mobility of $Cd_2SnO_4$ might be due to the crystal structure of this material. These favorable properties have made crystalline $Cd_2SnO_4$ potentially suitable for a wide range of semiconductor device fabrication applications and other applications.

Unfortunately, several challenges are presented by the large-scale manufacture of spinel $Cd_2SnO_4$ films. In particular, the processes that may be used to produce high-quality $Cd_2SnO_4$, for example radio frequency or magnetron sputtering plus high-temperature proximity heat treatment are not suitable for large-volume manufacture. In addition, the temperatures required for selected manufacturing steps prohibits the deposition of spinel or other crystalline $Cd_2SnO_4$ films on inexpensive substrates such as soda-lime glass that are desirable for high-volume production.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment is tin-cadmium oxide film having an amorphous structure and a ratio of tin atoms to cadmium atoms of between 1:1 and 3:1. The amorphous tin-cadmium oxide film may have an optical band gap of between 2.7 eV and 3.35 eV. The film may also have a charge carrier concentration of between $1\times10^{20}$ $cm^{-3}$ and $2\times10^{20}$ $cm^{-3}$. The tin cadmium oxide film may also exhibit a Hall mobility of between 40 $cm^2V^{-1} s^{-1}$ and 60 $cm^2V^{-1} s^{-1}$.

Another embodiment is a method of producing a tin-cadmium oxide film. The method includes introducing a tin precursor, cadmium precursor and oxygen into a low pressure deposition chamber having a chamber temperature of between 500° C. and 550° C. Under these conditions an amorphous tin-cadmium oxide material may be deposited onto a substrate where the tin-cadmium oxide material has a ratio of tin atoms to cadmium atoms of between 1:1 and 3:1. The precursors may be mixed with a carrier gas, including but not limited to nitrogen, before introducing the resulting precursor mixture into the low pressure deposition chamber. Suitable precursors include, but are not limited to tetramethyltin and dimethylcadmium.

In certain non-limiting embodiments the precursor mixture may be introduced at a ratio of between 0.5:1 and 5:1 of tetramethyltin to dimethylcadmium. The low pressure, low temperature deposition technique utilized may be a low pressure metalorganic chemical vapor deposition technique. Other suitable techniques may be employed which otherwise meet the described method parameters. The tin-cadmium oxide material may be deposited on a glass substrate, including but not limited to a soda-lime, borosilicate glass, or aluminosilicate substrate.

Another embodiment includes a photovoltaic device which includes a substrate and an amorphous tin-cadmium oxide film as described above. The substrate may be, but is not limited to a glass, for example, a soda-lime glass or borosilicate glass. The amorphous structure of a TCO film with high electrical and optical quality is desirable because the amorphous structure often provides superior diffusion characteristics (from either the glass substrate or from subsequently deposited device layers) or improved environmental stability compared to polycrystalline TCO materials.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
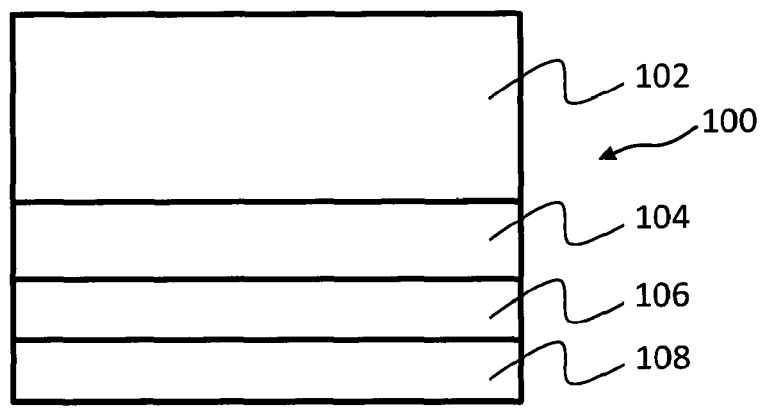
FIG. 1 is a schematic representation of a simplified photovoltaic device having an amorphous Sn—Cd—O layer.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise.

A material may be described herein according to its crystalline structure or lack of crystalline structure. For example, a material may be describes as "amorphous" which is defined as substantially lacking a crystalline structure. Alternatively, a material may be defined as being "single crystal." Single crystal very specifically means an ingot, wafer or epilayer that is truly a single crystal, with no grain boundaries. "Crystalline" is a more general term for a substantially crystalline material which can have grain boundaries. Crystalline shall be understood to mean substantially crystalline, and having sufficiently well developed crystal structure that one skilled in the art would refer to the material as being crystalline. The terms single crystal and crystalline do not mean absolutely defect free. Both types of material will have defects and or dislocations.

One embodiment disclosed herein is an amorphous tin-cadmium oxide film having a ratio of tin atoms to cadmium atoms of between 1:1 and 3:1. The disclosed tin-cadmium oxide films have the general formula Sn—Cd—O which may be abbreviated herein as SCO. Sn—Cd—O compounds belong to the transparent conducting oxide class of materials also known as "TCOs". TCOs are used extensively for a variety of applications including but not limited to architectural windows, flat-panel displays, thin-film photovoltaic devices, electrochromic windows and polymer-based electronics. TCOs are used in many of these implementations because these materials share the property of being both optically transparent and electrically conductive. Many alternative conducting materials are wholly or partially opaque at functionally important wavelengths of light. For example, metals which are highly conductive are generally not transparent. The combined attributes of transparency and conductivity exhibited by TCOs make these materials useful particularly as front contact layers in photovoltaic devices. Thus, TCOs are commonly used between a transparent substrate, which in use provides mechanical support and faces the sun and several active semiconductor layers. In this non-limiting representative configuration the TCO film functions as a front contact current collector while readily allowing the transmission of light to the subsequent active semiconductor layers.

One example of a TCO film which is useful as a front contact current collector is crystalline cadmium stannate ($Cd_2SnO_4$). Crystalline $Cd_2SnO_4$ is generally prepared in a multistep process including radio-frequency, direct-current, and/or magnetron sputtering followed by a high-temperature step. The high temperature step can prevent the deposition or fabrication of a crystalline $Cd_2SnO_4$ film directly on an inexpensive substrate, for example, soda-lime glass, because the process temperature causes the substrate to soften and deform. Also, known processes for the fabrication of crystalline $Cd_2SnO_4$ films typically result in a nearly stoichiometric ratio of cadmium to tin atoms (Sn:Cd—1:2) in the resulting film. Cadmium precursors are expensive and toxic. Accordingly, a film having the optical and chemical properties of crystalline $Cd_2SnO_4$, but prepared with substantially less cadmium and at lower process temperatures to allow the use of conventional glass substrates would be useful.

One aspect disclosed herein is a method of producing an amorphous Sn—Cd—O film under low pressure and at a low temperature. In particular, a low pressure metalorganic chemical vapor deposition technique (LP-MOCVD) may be used to produce an amorphous Sn—Cd—O film on an inexpensive substrate at a suitably low temperature. In one embodiment of the method a tin precursor, cadmium precursor, oxygen and a carrier gas may be introduced into a low pressure deposition chamber having a chamber temperature between 500° C. and 550° C. As described in detail below, amorphous Sn—Cd—O material may be deposited onto a substrate where the deposited material has a ratio of tin atoms to cadmium atoms between 1:1 and 3:1. A suitable but non-exclusive tin precursor is tetramethyltin; the method may be implemented with other metalorganic precursors as well. A suitable but non-exclusive cadmium precursor would be dimethylcadmium; the method may be implemented with other metalorganic precursors as well. These precursors may be mixed with oxygen and a carrier gas such as nitrogen prior to introduction into the low pressure deposition chamber or after introduction into the chamber. Suitable results have been observed where the ratio of tetramethyltin and dimethylcadmium in the precursor mixture is between 0.5:1 and 5:1.

The amorphous Sn—Cd—O material deposited as described herein has been observed to have an optical band gap of between 2.7 eV and 3.35 eV. In addition, the Sn—Cd—O film prepared as described herein has a charge carrier concentration of between $1 \times 10^{20}$ $cm^{-3}$ and $2 \times 10^{20}$ $cm^{-3}$. As a result of the charge carrier concentration and other factors, the amorphous Sn—Cd—O films described herein have a determined Hall mobility of between 40 $cm^2V^{-1}$ $s^{-1}$ and 60 $cm^2V^{-1}$ $s^{-1}$.

An alternative embodiment disclosed herein is a photovoltaic device including an amorphous Sn—Cd—O film as described. It should be noted that the amorphous Sn—Cd—O films disclosed have utility outside the field of photovoltaic devices. For example, these materials may be useful as a coating to enhance the energy performance of architectural windows and other glass products. However, the electrical and optical characteristics of the amorphous Sn—Cd—O films disclosed in combination with the suitability of a relatively inexpensive substrate such as soda-lime glass for the preparation of the disclosed materials makes the disclosed amorphous Sn—Cd—O films particularly well suited for use in the large scale fabrication of photovoltaic devices. The amorphous structure of the disclosed SCO films with high electrical and optical quality is advantageous because the amorphous structure often provides superior diffusion barrier characteristics (with respect to diffusion from either the glass substrate or from subsequently deposited device layers) and/or improved environmental stability, for example superior mechanical stability in water, when compared to polycrystalline TCO materials.

One representative, non-limiting and highly simplified device is the photovoltaic device 100 schematically illustrated in FIG. 1. This highly simplified photovoltaic device includes a transparent substrate 102 which may be a glass substrate, including not limited to a soda-lime glass substrate. An amorphous Sn—Cd—O film 104 which has a Sn to Cd ratio of between 1:1 and 3:1 is deposited on the substrate 102. The amorphous Sn—Cd—O film 104 may be deposited on the transparent substrate 102 by a low temperature, low pressure process such as LP-MOCVD as described below.

The representative, photovoltaic device also includes at least two semiconductor layers of different conductivity types (semiconductor layers 106 and 108) deposited on or in association with the Sn—Cd—O layer 104 to function as a photovoltaic junction for the device. A fully developed device is likely to include many semiconductor layers, junction layers, buffer layers, contacts and other layers.

In the photovoltaic device 100, the amorphous Sn—Cd—O film 104 functions as a transparent front contact. An amorphous Sn—Cd—O film 104 can further be implemented in many other types of devices for any suitable purpose, or may be implemented in a non-electrical apparatus such as an architectural window coating.

EXAMPLES

The following examples are provided for illustrative purposes only and are not intended to limit the scope of the disclosed embodiments or claims.

Example 1

Amorphous Sn—Cd—O films were fabricated using a commercially available LP-MOCVD system. Commercially available ultrahigh-purity tetramethyltin (TMT) and dimethylcadmium (DMCd) were used for the Sn and Cd precursors. UHP-grade oxygen was used for the oxidizer. Nitrogen carrier gas, the Sn and Cd precursors and oxygen were mixed before being introduced into a deposition region of the chamber via two gas injectors located on the top and bottom of a stainless steel chamber end cap flange.

Figure 2:
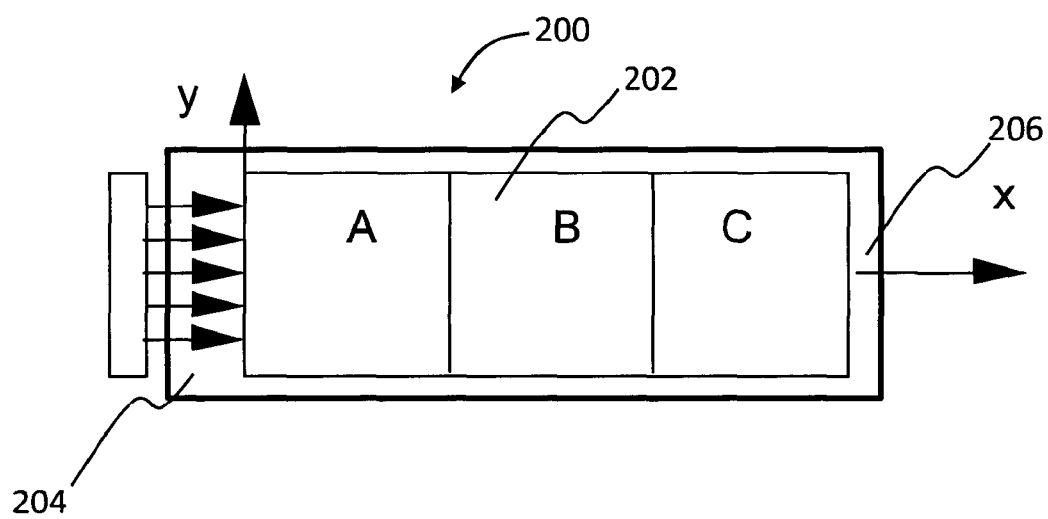
FIG. 2 is a schematic top view of a deposition chamber suitable for implementing the described methods of producing the described materials.

The horizontal LP-MOCVD reaction chamber 200 was a cold-walled, rectangular quartz tube. A schematic top view of the sample deposition zone 202 is shown in FIG. 2. The reactant gases entered at one end of the chamber 204, flowed along the chamber length, and were then pumped out from the other end of the chamber 206. The reactant gas flow direction may be defined as the x-axis. The transverse gas flow direction, along the sample surface, may be defined as the y-axis. Three borosilicate glass substrates, 1 mm thick and 102 mm×102 mm in area were coated for each deposition run. As described in detail below and schematically illustrated in FIG. 2, the three substrates are identified as A, B and C with A being placed toward the gas inlet and C being placed toward the outlet. Two deposition runs at somewhat different process conditions as described below were performed, resulting in three physical samples, A, B and C per run. These samples were further subdivided along the x axis for characterization as described in detail below.

The TMT and DMCd metal-organic precursors used in this example have different decomposition temperatures; therefore, at a given growth temperature, the decomposition rates of the Sn and Cd precursors were different. As reactant gas flowed along the x-axis as defined above, the precursor having a higher decomposition rate would deplete more quickly than the precursor having a lower decomposition rate. Thus, the quantities of available precursors would change along the x-axis, which in turn caused the composition of the Cd—Sn—O films to vary along the x-axis. By controlling the precursor ratio and deposition temperature, the composition and the composition gradient of the resulting films was varied.

The composition of the deposited films was analyzed by electron-probe microanalysis (EPMA) with a commercially available electron microprobe. In addition, the presence or absence of crystalline structure was assessed by X-ray diffraction. A spectrophotometer with an integrating-sphere detector and a helium-neon light was used to measure the total transmittance (T) and reflectance (R) spectrum of the films in the wavelength range of 200 to 2500 nm. The carrier concentration and electron mobilities of the films were determined by Hall measurements using the van der Pauw technique. For all the mentioned characterization, six data points were taken along the centerline of each 102 mm×102 mm substrate positioned along the x axis of the process chamber as described above. The size of any specific sampling area depended upon the selected characterization technique.

The precursor ratio of DMCd to TMT and the growth temperature were varied to fabricate samples with different compositions. Deposition run SCO-53 was deposited at a chamber temperature of 550° C. with a TMT-to-DMCd precursor ratio of 0.5:1. Deposition run SCO-50 was deposited at a chamber temperature of 500° C. with a TMT-to-DMCd precursor ratio of 5:1. At both deposition temperatures of around 500° and 550° C., the decomposition rate of DMCd was observed to be much higher than that of TMT; thus, a relatively Cd-rich film formed at the leading edge of the substrates and a relatively Sn-rich film formed at the tailing edge of the substrates. In order to characterize these compositionally graded samples, each substrate glass piece was cut into six small pieces and numbered 1-6 along the x-axis from inlet to outlet for characterization.

Figure 3A:
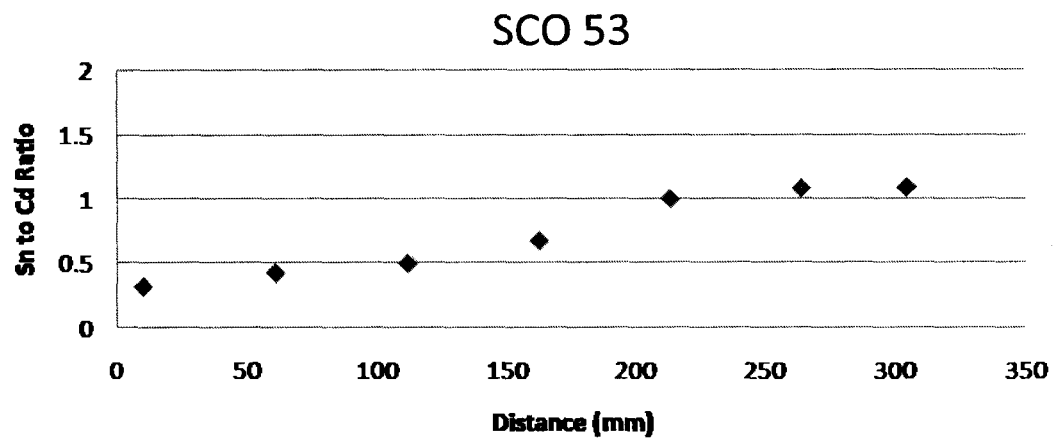
FIGS. 3A and 3B are graphic representations of the Sn:Cd compositional ratio of selected Sn—Cd—O materials produced as described herein.
Figure 3B:
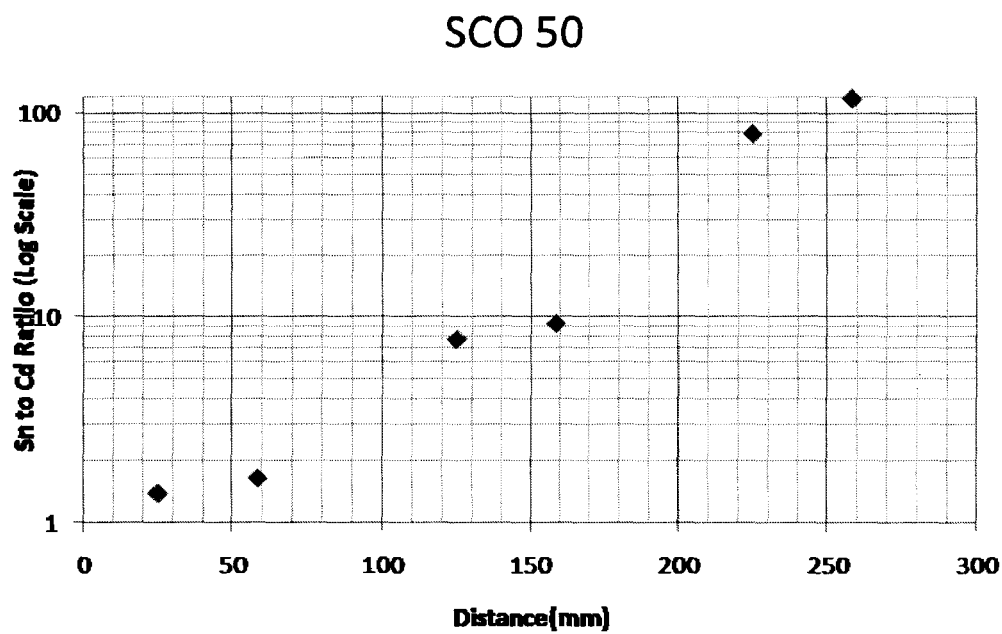

FIG. 3A illustrates the results of a compositional analysis taken from sample SCO-53 by EPMA. The EPMA sampling area is of approximately a one millimeter range. For each of three primary substrate samples, a thin strip was cut off along the glass centerline (x-axis). Then, this strip was cut into 6 small pieces. The compositional analysis results indicate that the Sn-to-Cd ratio on sample SCO-53C ranged from about 0.33:1 to about 1:1. Similar analysis shown on FIG. 3B shows a Sn-to-Cd ratio ranging from about 1.5:1 to 3.5:1 in the amorphous zone, for sample SCO-50A. Thus, each of these precursor and temperature ratios produced materials featuring a higher Sn content than known samples of crystalline $Cd_2SnO_4$.

Figure 4A:
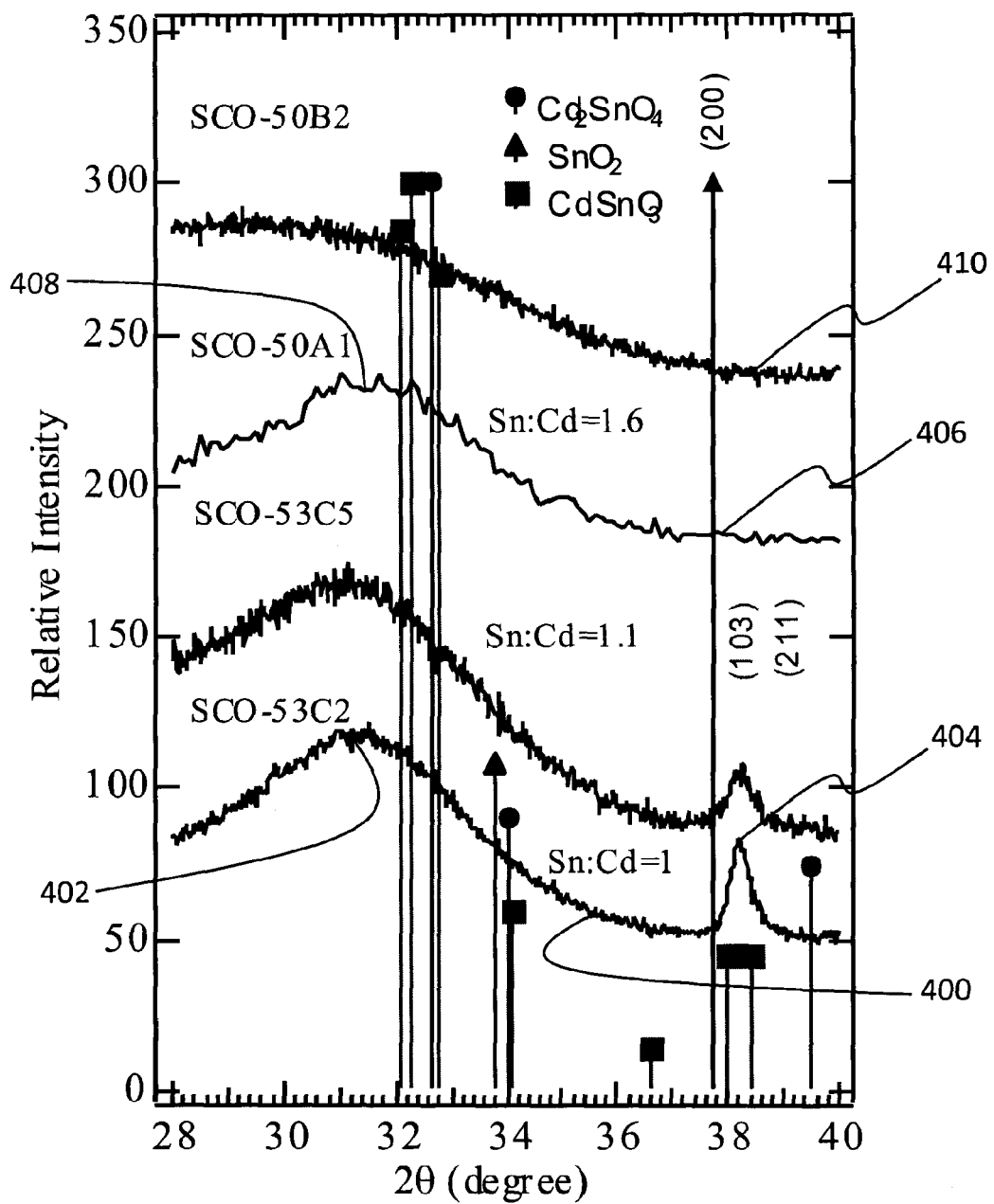
FIGS. 4A and 4B are plots of selected x-ray diffraction patterns taken from samples of Sn—Cd—O materials produced as described herein.

The crystal structure of the thin film samples was investigated using XRD with Cu $K_\alpha$ radiation ($\lambda$=1.5416 Å). Sample run SCO-53 was fabricated with a TMT-to-DMCd ratio of 0.5:1, thus, it should be a Cd-rich film. The XRD pattern indicated that the SCO-53A and SCO-53B samples are polycrystalline with a mixed phase of CdO and $Cd_2SnO_4$ and the SCO-53C sample is amorphous. It may be noted from FIG. 3A that the Sn-to-Cd ratio for SCO-53C is close to 1:1. FIG. 4A. illustrates that the XRD pattern 400 of sample SCO-53C2 does not show noticeable diffraction peaks, plus there is a large hump 402 around 2θ equal to 31° ($P_{31}$), which indicates that the Sn—Cd—O film produced on plate C of the SCO-53 run is amorphous. Another small but broad peak 404 at 2θ close to 38° is possibly due to a CdSnO$_3$ phase. The orthorhombic CdSnO$_3$ phase would be expected to produce two peaks at angular position around 2θ=38°. Thus, it may be concluded that for sample SCO-53C, where the Sn to Cd compositional ratio is about 1:1, the material is predominately of an amorphous structure.

Figure 4B:
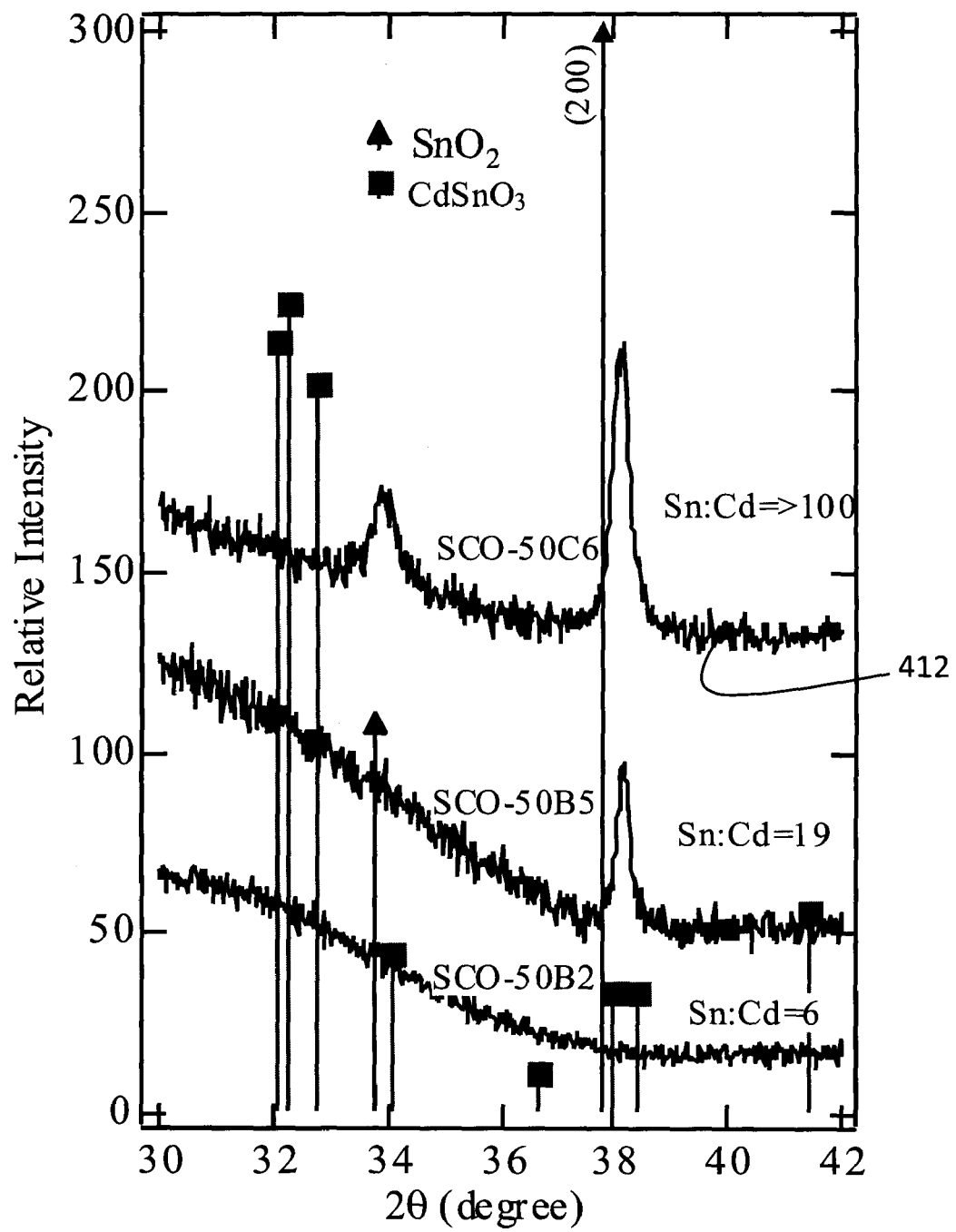

Sample SCO-50 was fabricated with a TMT-to-DMCd ratio of 5:1. This precursor ratio was selected to produce a Sn-rich film. From the XRD patterns of FIGS. 4A and 4B, it can be seen that for material deposited toward the inlet of the deposition chamber, the SCO-50 samples have a material composition similar to the composition of the samples deposited in the SCO-53 run toward the exit from the chamber. In particular, the XRD pattern 406 (FIG. 4A) of sample SCO-53A, indicates the broad peak 408 of P$_{31}$, which indicates an amorphous structure. As the sampling position moves downstream along to x-axis the broad amorphous peak P$_{31}$ disappears. As illustrated in XRD pattern 410, no crystal structure may be detected at the SCO-50B2 location. The Sn-to-Cd ratio at this location is larger than 3:1. As the sampling position continued to move downstream, as best shown on FIG. 4B, (the XRD pattern 412 corresponding to sample run SCO-50, position C6) a new SnO$_2$ phase appears. It may be concluded that a purely amorphous film was formed which converted to CdO+Cd$_2$SnO$_4$ cubic structure and then to SnO$_2$ tetragonal structure as the deposition process progressed and the Cd precursor became depleted.

Figure 5:
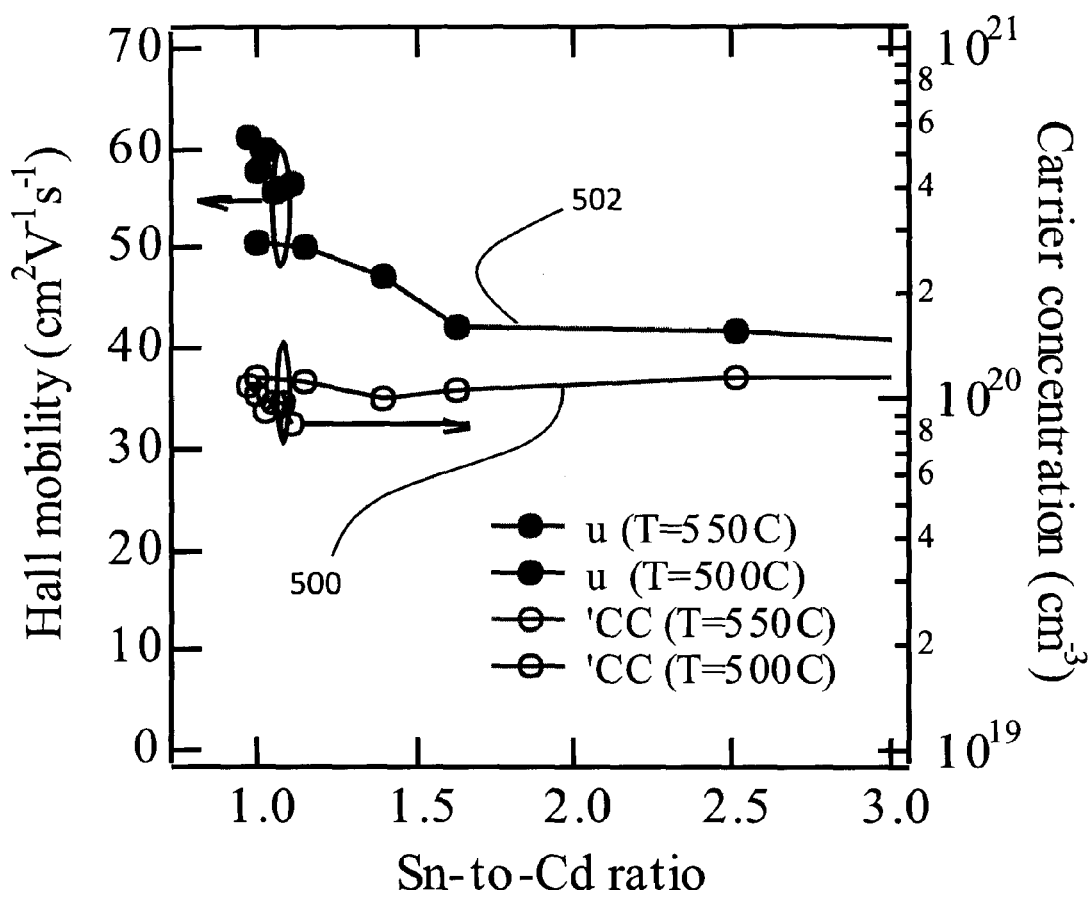
FIG. 5 is a graphic representation of selected electrical properties of samples of Sn—Cd—O materials produced as described herein.

Along with compositional and structural analysis, the electronic and optical properties of the deposited films were analyzed. In the mixed polycrystalline zones of the deposited materials, the carrier concentration was about $5 \times 10^{20}$ cm$^{-3}$ and the Hall mobility was about 20 cm$^2$V$^{-1}$ s$^{-1}$, which are similar to the values observed on known defected CdO films. As Cd was depleted along the x-axis, the carrier concentration is seen to decrease and the Hall mobility is seen to increase. FIG. 5 illustrates that at the compositional Sn-to-Cd ratio of 1:1 within the amorphous zone, the carrier concentration is about $1~2 \times 10^{20}$ cm$^{-3}$ and the Hall mobility is 40~50 cm$^2$V$^{-1}$ s$^{-1}$ for the samples deposited at 500° C. (see plot 500). The Hall mobility was measured to be about 50-60 cm$^2$V$^{-1}$ s$^{-1}$ for the sample deposited at 550° C. (see plot 502). The measured Hall mobilities are very high for an amorphous material, and unexpectedly close to those measured for polycrystalline Cd$_2$SnO$_4$ formed with a higher temperature sputtering process.

It may be noted that surprisingly, the highest electron mobilities were observed in the amorphous zones. The observed values of electron mobility were as high as 61 cm$^2$V$^{-1}$ s$^{-1}$, which is very close to the values observed for polycrystalline materials. This result was unexpected in view of the mobilities known for other materials which can be fabricated in both crystalline and amorphous phases. For example, with respect to Si, the electron mobility of amorphous Si is on the order of $10^{-3}$ cm$^2$V$^{-1}$ s$^{-1}$, which is about 3 orders of magnitude lower than the electron mobility values observed for polycrystalline Si.

Figure 6A:
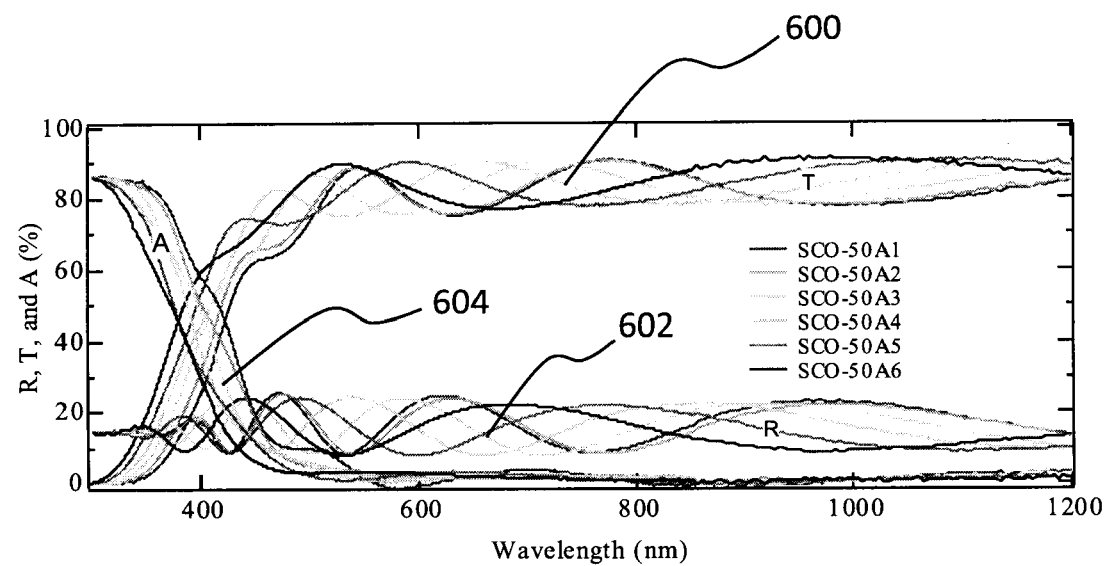
FIGS. 6A and 6B are plots of selected optical properties of Sn—Cd—O materials produced as described herein.
Figure 6B:
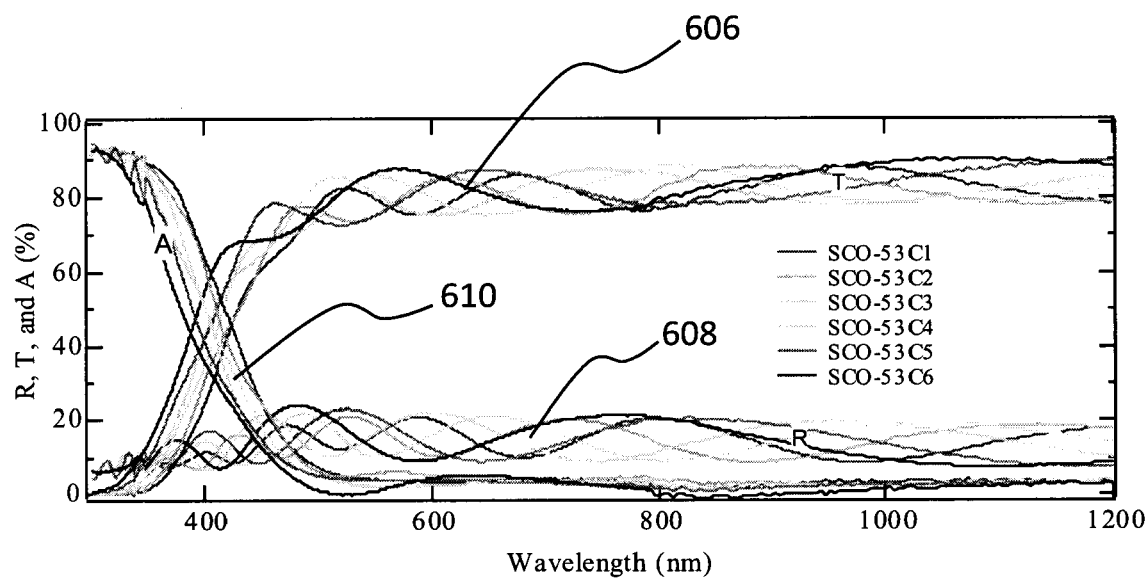

The optical properties of the Sn—Cd—O films prepared as described above were also characterized. FIG. 6A shows plots 600 for the transmittance (T %), plots 602 for reflectance (R %) and plots 604 for the absorbance (A %) spectra of SCO-53C1 to C6 films, each having different Sn-to-Cd ratios. The optical transmission values of the SCO films were observed to be high, at about 85% across most of the visible-wavelength range (when deposited on a glass substrate). The absorption values of the various SCO films were observed to be less than 5% across most of the visible-wavelength range. The bandgap absorption edge moved from longer wavelengths to short wavelength as Sn content increased. Similar transmittance, reflectance and absorption values were observed with respect to SCO-50A1 to A6 films, as shown on FIG. 6B. See in particular plots 606 of transmittance, plots 608 of reflectance and plots 610 of absorption spectra.

Figure 7:
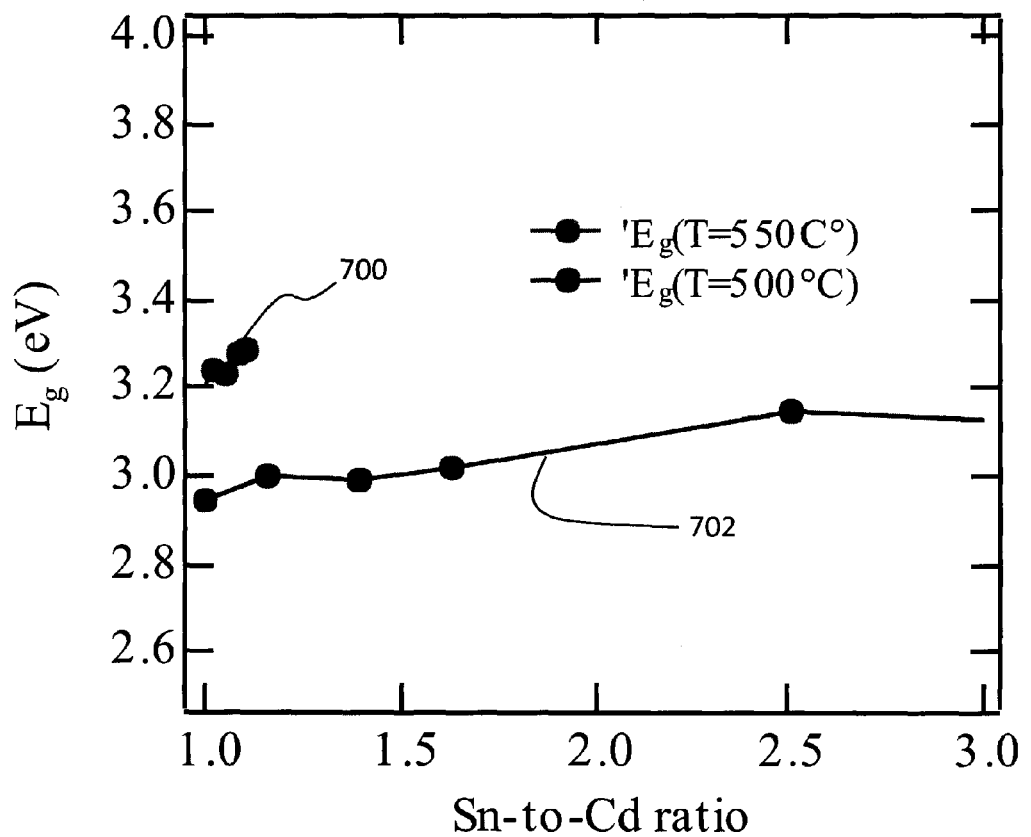
FIG. 7 is a plot of the optical bandgaps of Sn—Cd—O materials produced as described herein.

The optical bandgap for each sample, calculated from transmittance and reflectance data were also determined. As illustrated on FIG. 7 with respect to samples from the SCO-53 run, the optical band gap is about 3.2 eV for materials with a Sn-to-Cd ratio of 1-to-1 (See plot 700). For sample run SCO-50, deposited at 500° C., where the Sn-to-Cd ratio is also approximately 1:1, the band gap is narrower. The value of the band gap was observed to increase as the Sn content of the material increased. As shown by plot 702, bandgaps of between 2.9 eV and 3.1 eV were observed as the Sn-to-Cd ratio of the SCO-50 material varied from 1:1 to 3:1.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope. All references cited herein are incorporated in their entirety by reference.

What is claimed is:

1. A method of producing a tin-cadmium oxide film comprising:
    introducing a tin precursor in a carrier gas into a low pressure deposition chamber having a chamber temperature of between 500° C. and 550° C.;
    introducing a cadmium precursor in a carrier gas into the low pressure deposition chamber;
    introducing oxygen into the low pressure deposition chamber; and
    depositing a tin-cadmium oxide material onto a substrate wherein the tin-cadmium oxide material comprises an amorphous structure and a ratio of tin atoms to cadmium atoms of between 1:1 and 3:1.

2. The method of producing a tin-cadmium oxide film of claim 1 further comprising mixing the cadmium precursor, tin precursor and oxygen with a carrier gas before introducing the resulting precursor mixture into the low pressure deposition chamber.

3. The method of producing a tin-cadmium oxide film of claim 2 wherein the tin precursor comprises tetramethyltin.

4. The method of producing a tin-cadmium oxide film of claim 3 wherein the cadmium precursor comprises dimethylcadmium.

5. The method of producing a tin-cadmium oxide film of claim 4 wherein the ratio of tetramethyltin to dimethylcadmium in the precursor mixture is between 0.5:1 and 5:1.

6. The method of producing a tin-cadmium oxide film of claim 1 further comprising depositing the tin-cadmium oxide material with a metalorganic chemical vapor deposition technique.

7. The method of producing a tin-cadmium oxide film of claim 1 further comprising depositing the tin-cadmium oxide material on a glass substrate.

8. The method of producing a tin-cadmium oxide film of claim 1 wherein the deposited tin-cadmium oxide material has an optical bandgap of between 2.7 eV and 3.35 eV.

9. The method of producing a tin-cadmium oxide film of claim 1 wherein the deposited tin-cadmium oxide material has a charge carrier concentration of between $1\times10^{20}$ cm$^{-3}$ and $2\times10^{20}$ cm$^{-3}$.

10. The method of producing a tin-cadmium oxide film of claim 1 wherein the deposited tin-cadmium oxide material exhibits a Hall mobility of between 40 cm$^2$V$^{-1}$ s$^{-1}$ and 60 cm$^2$V$^{-1}$ s$^{-1}$.

* * * * *